United States Patent
Rogers et al.

(10) Patent No.: US 6,707,075 B1
(45) Date of Patent: Mar. 16, 2004

(54) METHOD FOR FABRICATING AVALANCHE TRENCH PHOTODETECTORS

(75) Inventors: Dennis L. Rogers, New York, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/317,665

(22) Filed: Dec. 10, 2002

(51) Int. Cl.[7] .......................... H01L 21/66; G01R 31/26
(52) U.S. Cl. ..................... 257/117; 257/438; 438/16; 438/42; 438/45
(58) Field of Search .................. 257/98, 116–118, 257/431–438; 438/16, 22–45

(56) References Cited

U.S. PATENT DOCUMENTS

| | | | |
|---|---|---|---|
| 5,144,381 A | * | 9/1992 | Furuyama et al. .......... 257/186 |
| 6,177,289 B1 | | 1/2001 | Crow et al. ................. 438/16 |
| 6,451,702 B1 | | 9/2002 | Yang et al. ................ 438/706 |
| 6,492,657 B1 | * | 12/2002 | Burlefinger et al. .......... 257/10 |

* cited by examiner

Primary Examiner—H. Jey Tsai
(74) Attorney, Agent, or Firm—F. Chau & Associates, LLP

(57) ABSTRACT

A method of forming an avalanche trench optical detector device on a semiconductor substrate, comprising forming a first set and a second set of trenches in the substrate, wherein trenches of the first set are alternately disposed with respect to trenches of the second set, filling the trenches with a doped sacrificial material, and annealing the device to form a multiplication region in the substrate. The method comprises etching the doped sacrificial material from the first set of trenches, filling the first set of trenches with a doped material of a first conductivity, etching the doped sacrificial material from a second set of trenches, and filling the second set of trenches with a doped material of a second conductivity. The method further comprises providing separate wiring connections to the first set of trenches and the second set of trenches.

18 Claims, 4 Drawing Sheets

METHOD FOR FABRICATING AVALANCHE TRENCH PHOTODETECTORS

BACKGROUND OF INVENTION

1. Field of the Invention

The present invention relates to optical detectors that convert light into an electric current, and more particularly to detectors used in high speed fiber optic communication.

2. Discussion of Related Art

As the data rates used in fiber optic communications go above 40 Gbits/second high speed, sensitive optical detectors are need. III–V semiconductor PIN detectors using materials such as GaAs and InGaAs have been used in this capacity. However, with the invention of the Lateral Trench Detector (LTD) (U.S. Pat. No. 6,177,289) it has become possible to achieve these high speeds using silicon PIN detectors A drawback of silicon PIN detectors, however, is it's relatively large capacitance compared to the more conventional PIN detectors. This capacitance in turn requires the use of lower impedance amplifiers with an attendant increase in circuit noise that limits the sensitivity achievable using the silicon PIN detectors.

An avalanche detector operates similarly to a silicon PIN detector but uses avalanche multiplication to achieve gain (more than one electron per photon). Because of the improved,gain the detector is less sensitive to circuit noise. Further, receivers utilizing this technology can achieve higher sensitivities.

Therefore, a need exists for a method of fabricating LTDs that realize avalanche gain.

SUMMARY OF THE INVENTION

According to an embodiment of the present invention, a method of forming an avalanche trench optical detector device on a semiconductor substrate, comprising forming a first set and a second set of trenches in the substrate, wherein trenches of the first set are alternately disposed with respect to trenches of the second set, filling the trenches with a doped sacrificial material, and annealing the device to form a multiplication region in the substrate. The method comprises etching the doped sacrificial material from the first set of trenches, filling the first set of trenches with a doped material of a first conductivity, etching the doped sacrificial material from a second set of trenches, and filling the second set of trenches with a doped material of a second conductivity. The method further comprises providing separate wiring connections to the first set of trenches and the second set of trenches.

The first set and the second set of trenches in the substrate are formed simultaneously.

Etching the doped sacrificial material from the first set of trenches further comprises removing the doped sacrificial material from a surface of the device, and masking the second set of trenches.

Providing separate wiring connections further comprises exposing the doped material filling the first set of trenches and the doped material filling the second set of trenches to a surface of the device, and providing each of the first set of trenches with a first set of contacts and the second set of trenches with a second set of contacts.

Annealing further comprises depositing a diffusion barrier layer over a surface of the device prior to forming the multiplication region, and removing the diffusion barrier layer from a surface of the device after forming the multiplication region.

The material of the first conductivity comprises n type doped poly-silicon and the material of the second conductivity comprises p type doped poly-silicon. The material of the first conductivity comprises p type doped poly-silicon and the material of the second conductivity comprises n type doped poly-silicon.

The substrate includes a semiconductor material, a $SiO_2$ layer deposited over the semiconductor material, and a SiN layer deposited over the a $SiO_2$ layer.

Etching the sacrificial material from a second set of trenches further comprises the step of exposing the sacrificial material of the second set of trenches to a surface of the device by mechanical polish.

The doped sacrificial material is one of p type doped poly-silicon and n type doped poly-silicon.

According to an embodiment of the present invention, a method of forming an avalanche trench optical detector device on a semiconductor substrate, comprises forming a first set and a second set of trenches in the substrate, wherein trenches of the first set are alternately disposed with respect to trenches of the second set, filling the trenches with a doped sacrificial material, and forming a multiplication region in the substrate surrounding a bottom portion of the trenches. The method further comprises etching the doped sacrificial material from the first set of trenches, filling the first set of trenches with a doped material of a first conductivity, etching the doped sacrificial material from a second set of trenches, and filling the second set of trenches with a doped material of a second conductivity. The method comprises providing separate wiring connections to the first set of trenches and the second set of trenches.

The first set and the second set of trenches in the substrate are formed simultaneously.

Etching the doped sacrificial material from the first set of trenches further comprises removing the doped sacrificial material from a surface of the device, and masking the second set of trenches.

Providing separate wiring connections further comprises exposing the doped material filling the first set of trenches and the doped material filling the second set of trenches to a surface of the device, and providing each of the first set of trenches with a first set of contacts and the second set of trenches with a second set of contacts.

The material of the first conductivity comprises n type doped poly-silicon and the material of the second conductivity comprises p type doped poly-silicon. The material of the first conductivity comprises p type doped poly-silicon and the material of the second conductivity comprises n type doped poly-silicon.

The doped sacrificial material is one of p type doped poly-silicon and n type doped poly-silicon.

According to an embodiment of the present invention, an avalanche trench optical detector device comprises a substrate, a first set of trenches in the substrate having a doped material of a first conductivity, and a second set of trenches in the substrate having a doped material of a second conductivity, wherein trenches of the first set are alternately disposed with respect to trenches of the second set. The device comprises a multiplication region in the substrate surrounding a lower portion of the first set and the second set of trenches, wherein the multiplication region comprises about 10 percent of a photoactive area, and a first connection and a second connection coupled to the first set of trenches and the second set of trenches respectively.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

The avalanche process is caused by scattering events in which a single electron or hole is accelerated by a large electric field to the point where collisions can occur in which otherwise bound electrons are excited from a valance band to a conduction band resulting in an additional, mobile, electron hole pair. The additional charge carriers are swept to the n and p type contacts along with the photo-generated carriers resulting in an increase in the photo-current and thus gain. To obtain high speed and low noise gain, however, it is important that the avalanche multiplication occurs in a restricted region of the detector and that multiplication occurs primarily for one type of carrier. For high speed and low noise, the avalanche multiplication preferably occurs for the initial photogenerated carriers and not for the carriers created by subsequent multiplications. Carriers generated from these subsequent multiplications have a statistical distribution that results in more noise. Also these carriers result in a reduced speed due to the time needed for the transport of carriers created by the additional multiplications.

This restricted region in which multiplication takes place may be created by lightly doping a narrow region near the n type trenches. This doping must be light enough that the region remains depleted during normal operation and narrow enough that the multiplication remains confined to a small portion of the photoactive area. The area is about less than 10 percent of the photoactive area.

Figure 1A:
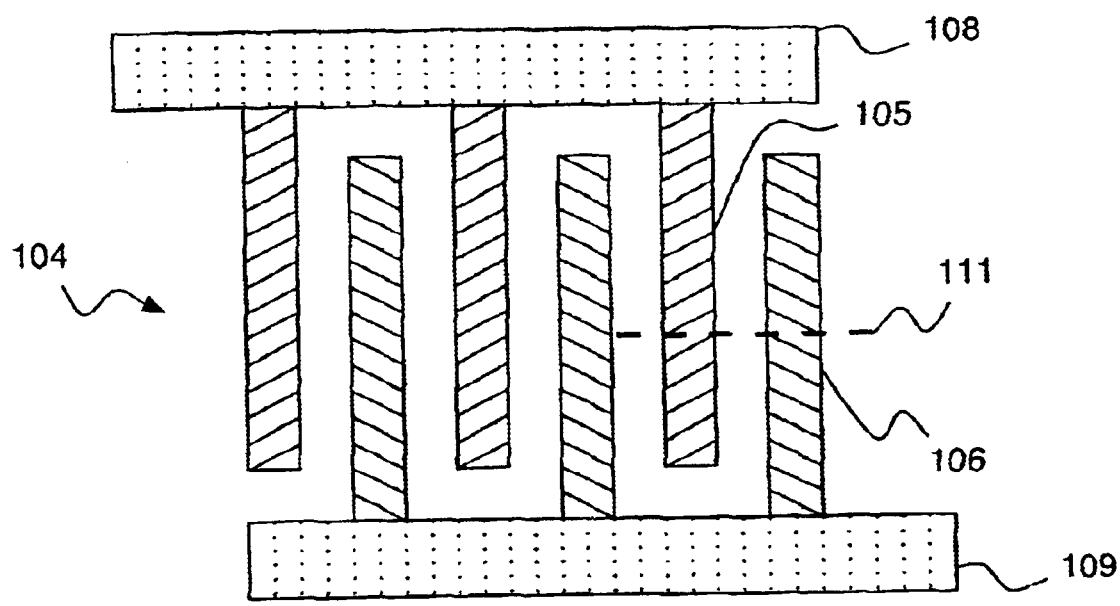
FIG. 1A is a top view of an avalanche trench photodetector according to an embodiment of the present invention.
Figure 1B:
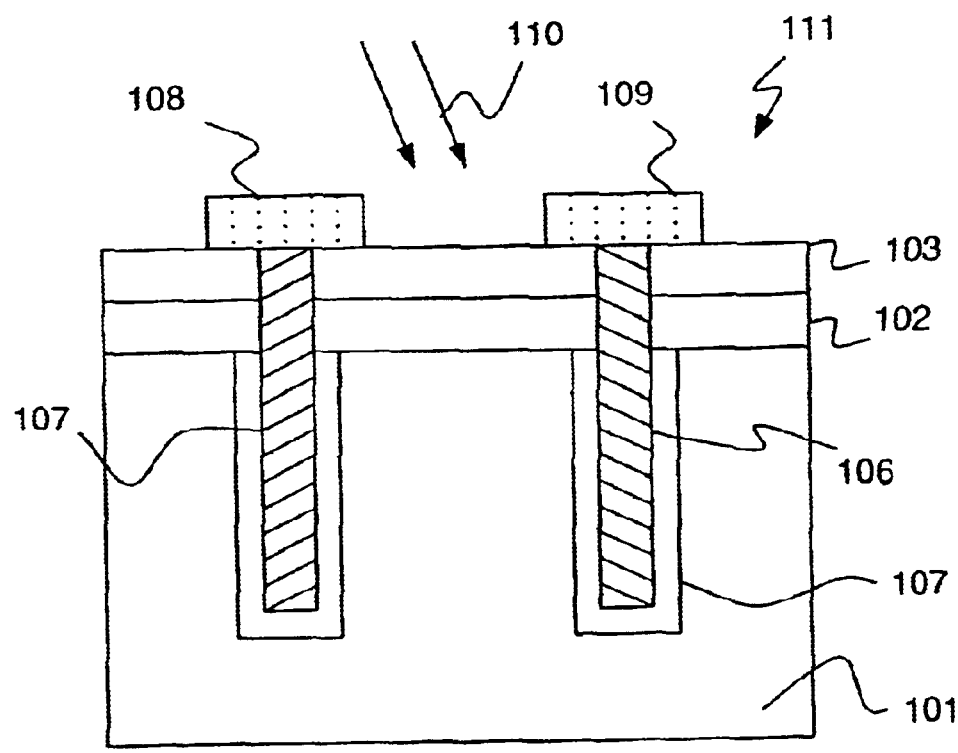
FIG. 1B is a diagram of a cross section of the avalanche trench photodetector depicted in FIG. 1A.

Referring to the drawings, FIGS. 1A and 1B, an Avalanche Trench Detector (ATD) comprises an intrinsic silicon substrate 101, a silicon oxide layer ($SiO_3$). 102 and a silicon nitride (SiN) layer 103. The ATD further comprises an array of trenches 104 etched into the silicon substrate 101 and filled with amorphous silicon. The trenches alternately filled with doped n type poly-silicon 105 and p type poly-silicon 106. The area surrounding a bottom portion of each trench, e.g., 107 is doped to form a junction layer or multiplication region. Contacts (108, 109) are formed to the trenches, one contact 108 coupled to the n type trenches and the other contact 109 coupled to the p type trenches.

When a voltage is applied between the contacts (108, 109) with a positive terminal connected to the n type trenches, and light 110 falls between the pairs of trenches, electron-hole pairs are created that give rise to a photocurrent.

A preferred method for fabricating the trench APD is described with reference to FIGS. 2A to 2D. The detector structure is fabricated on a lightly doped silicon substrate (e.g., less than $10^{16}$ $cm^{-3}$) such that the region between trenches can be completely depleted.

Figure 2A:
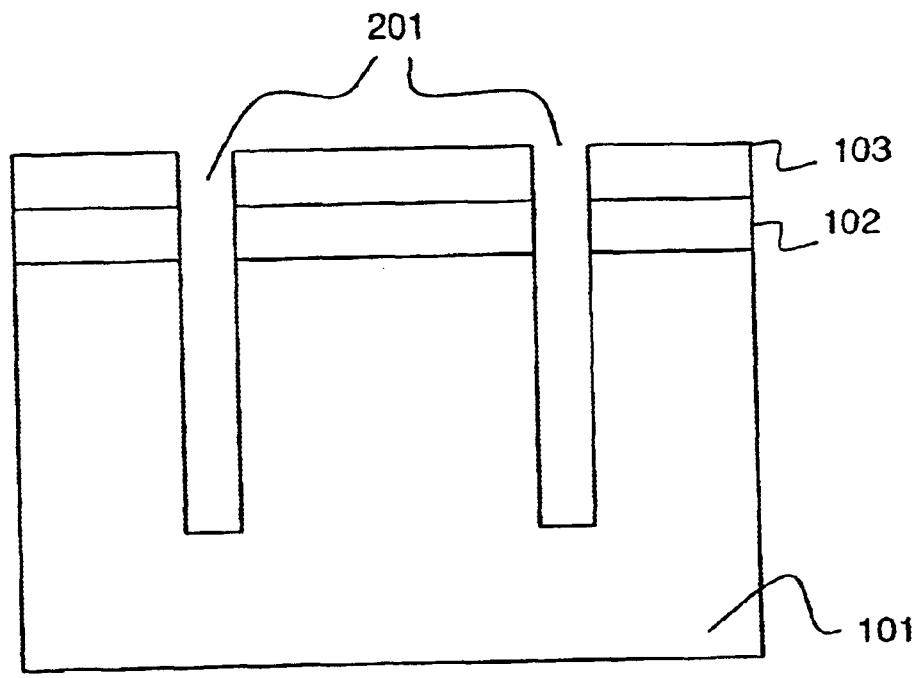
FIGS. 2A–2D are diagrams of an avalanche trench photodetector at various states of completion according to an embodiment of the present invention.

As shown in the cross sectional diagram in FIG. 2A, a thermal oxide 102 is formed on the surface followed by a deposited layer of SiN 103 to protect the surface of the silicon substrate 101 from further processing. An interpenetrating array of trenches 201 is etched through the dielectric layers (102, 103) and into the silicon substrate 101 using Reactive Ion Etching to a depth comparable to the optical extinction length of the optical radiation which is from 8 to 20 $\mu$m for a 850 nm wavelength 301.

Figure 2B:
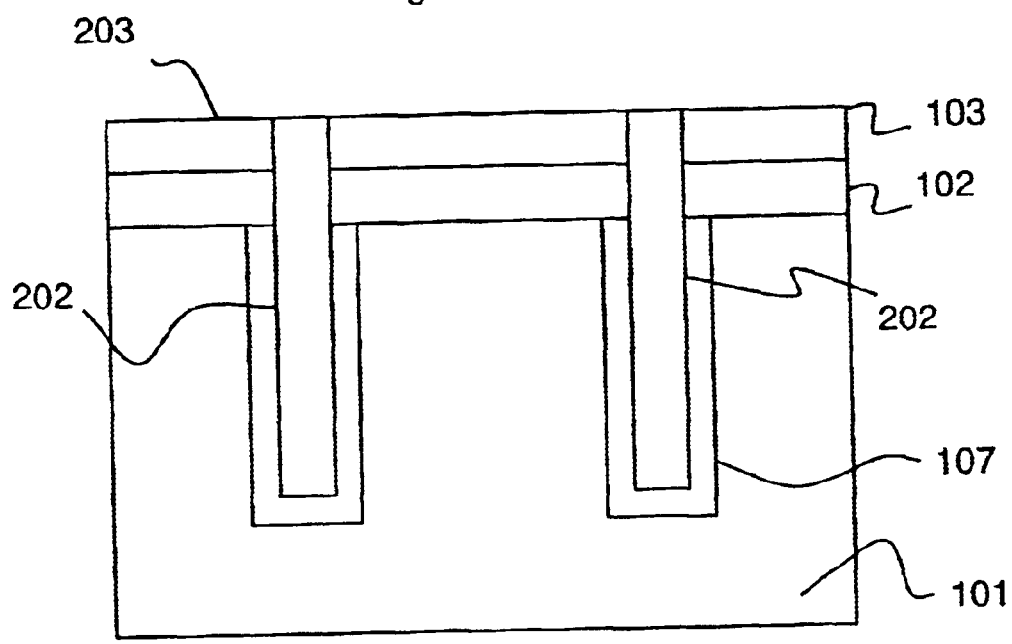
Figure 2C:
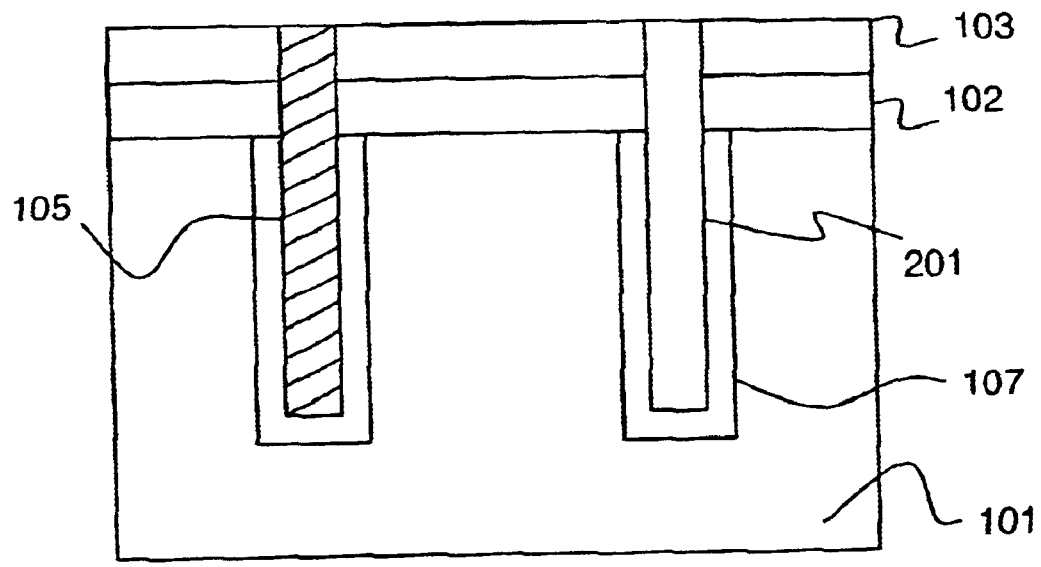
Figure 2D:
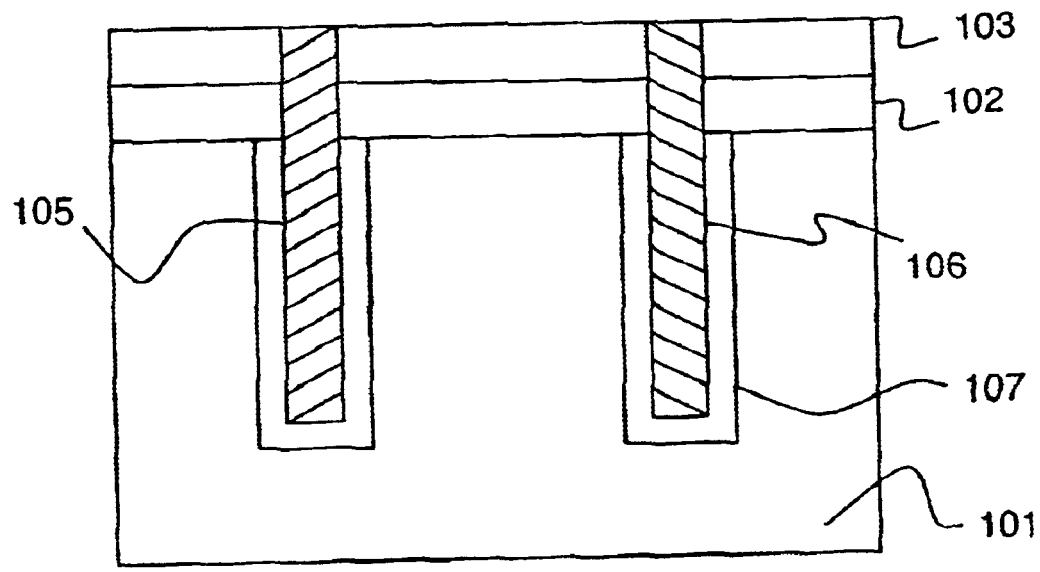

As shown in FIG. 2B, a layer of BoroSilicateGlass (BSG) or other material acting as a doping source 202 is deposited filling the trenches 201. An anneal is performed to diffuse boron into the region neighboring the trenches creating the lightly doped multiplication region 107. A Chemical-Mechanical-Polish, CMP, planarizes the surface to the SiN layer 103, removing any BSG from a top surface of the device 203. The BSG is stripped from one of the sets of trenches, as shown in FIG. 2C, and n+ poly-silicon 105 is deposited filling the open trenches. As shown in FIG. 2D, the remaining BSG is then stripped and p+ poly-silicon 106 deposited to fill the second set of trenches, followed by another CMP planarization to the SiN layer 103, exposing the poly-silicon material in the trenches. Referring to FIGS. 1A and 1B, contacts (108, 109) are formed using conventional technology to form the completed detector.

Figure 3:
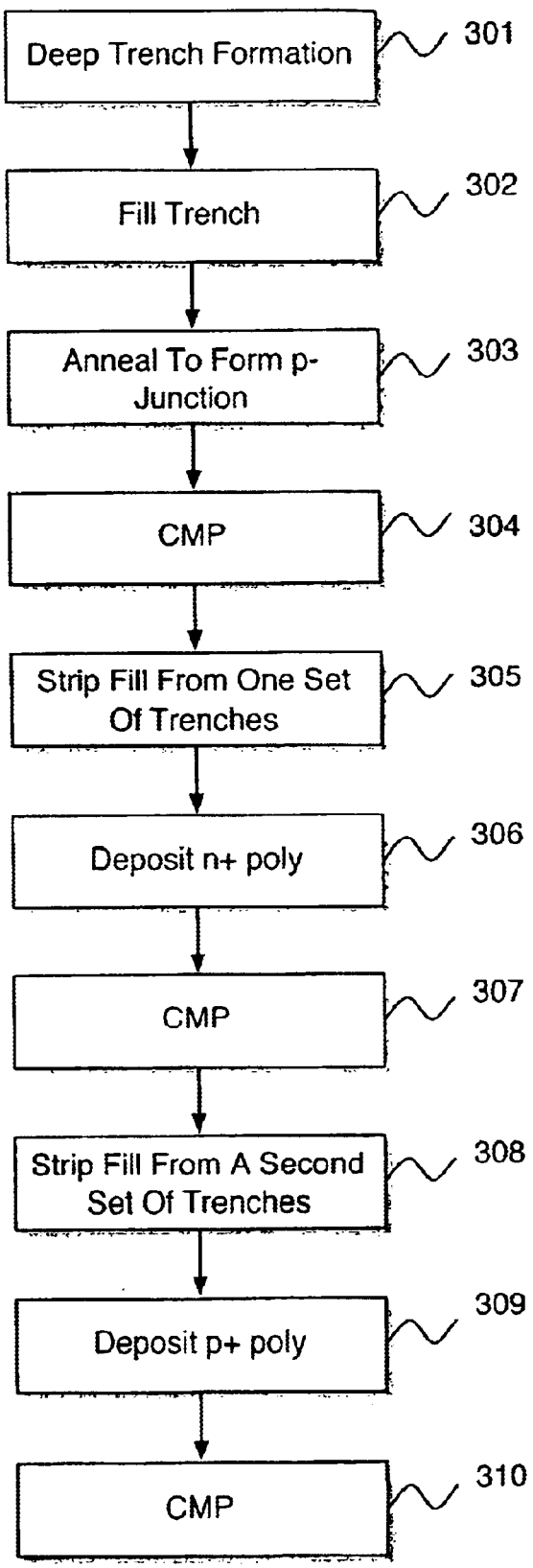
FIG. 3 is a flow chart of a method according to an embodiment of the present invention.

Referring to FIG. 3, an interpenetrating array of trenches is etched through the dielectric layers and into the silicon substrate using Reactive Ion Etching to a depth comparable to the optical extinction length of the optical radiation which is from 8 to 20 $\mu$m for a 850 nm wavelength 301. The trenches are filled with a layer of doped sacrificial material, preferably p doped, acting as a source of dopants 302. An anneal is performed to diffuse a dopant, such as Boron, into the region surrounding a bottom portion of the trenches creating the lightly doped multiplication region 303. A TEOS diffusion barrier is deposited prior to annealing. A first CMP is performed to planarize the surface to the SiN layer 304. The doped material is stripped from one of the sets of trenches 305 and n+ poly-silicon is deposited, filling the open trenches 306. Prior to stripping the doped material from the first set of trenches, the second set of trenches is masked by, for example, amorphous Silicon. A second CMP step can be performed 307 to remove the mask and expose remaining doped material in the second set of trenches. The remaining doped material is stripped 308 and p+ poly-silicon deposited to fill the second set of trenches 309, followed by another CMP planarization to the SiN layer 310.

Having described embodiments for an avalanche trench photodetector and method for fabricating the same, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A method of forming an avalanche trench optical detector device on a semiconductor substrate, comprising the steps of:

forming a first set and a second set of trenches in the substrate, wherein trenches of the first set are alternately disposed with respect to trenches of the second set;

filling the trenches with a doped sacrificial material;

annealing the device to form a multiplication region in the substrate;

etching the doped sacrificial material from the first set of trenches;

filling the first set of trenches with a doped material of a first conductivity;

etching the doped sacrificial material from a second set of trenches;

filling the second set of trenches with a doped material of a second conductivity; and providing separate wiring connections to the first set of trenches and the second set of trenches.

2. The method of claim 1, wherein the first set and the second set of trenches in the substrate are formed simultaneously.

3. The method of claim 1, wherein the step of etching the doped sacrificial material from the first set of trenches further comprises the steps of:

removing the doped sacrificial material from a surface of the device; and masking the second set of trenches.

4. The method of claim 1, wherein the step of providing separate wiring connections further comprises the steps of:

exposing the doped material filling the first set of trenches and the doped material filling the second set of trenches to a surface of the device; and providing each of the first set of trenches with a first set of contacts and the second set of trenches with a second set of contacts.

5. The method of claim 1, wherein the step of annealing further comprises the steps of:

depositing a diffusion barrier layer over a surface of the device prior to forming the multiplication region; and removing the diffusion barrier layer from a surface of the device after forming the multiplication region.

6. The method of claim 1, wherein the material of the first conductivity comprises n type doped poly-silicon and the material of the second conductivity comprises p type doped poly-silicon.

7. The method of claim 1, wherein the material of the first conductivity comprises p type doped poly-silicon and the material of the second conductivity comprises n type doped poly-silicon.

8. The method of claim 1, wherein the substrate includes a semiconductor material, a $SiO_2$ layer deposited over the semiconductor material, and a SiN layer deposited over the a $SiO_2$ layer.

9. The method of claim 1, wherein the step of etching the sacrificial material from a second set of trenches further comprises the step of exposing the sacrificial material of the second set of trenches to a surface of the device by mechanical polish.

10. The method of claim 1, wherein the doped sacrificial material is one of p type doped poly-silicon and n type doped poly-silicon.

11. A method of forming an avalanche trench optical detector device on a semiconductor substrate, comprising the steps of:

forming a first set and a second set of trenches in the substrate, wherein trenches of the first set are alternately disposed with respect to trenches of the second set;

filling the trenches with a doped sacrificial material;

forming a multiplication region in the substrate surrounding a bottom portion of the trenches;

etching the doped sacrificial material from the first set of trenches;

filling the first set of trenches with a doped material of a first conductivity;

etching the doped sacrificial material from a second set of trenches;

filling the second set of trenches with a doped material of a second conductivity; and providing separate wiring connections to the first set of trenches and the second set of trenches.

12. The method of claim 11, wherein the first set and the second set of trenches in the substrate are formed simultaneously.

13. The method of claim 11, wherein the step of etching the doped sacrificial material from the first set of trenches further comprises the steps of:

removing the doped sacrificial material from a surface of the device; and masking the second set of trenches.

14. The method of claim 11, wherein the step of providing separate wiring connections further comprises the steps of:

exposing the doped material filling the first set of trenches and the doped material filling the second set of trenches to a surface of the device; and providing each of the first set of trenches with a first set of contacts and the second set of trenches with a second set of contacts.

15. The method of claim 11, wherein the material of the first conductivity comprises n type doped poly-silicon and the material of the second conductivity comprises p type doped poly-silicon.

16. The method of claim 11, wherein the material of the first conductivity comprises p type doped poly-silicon and the material of the second conductivity comprises n type doped poly-silicon.

17. The method of claim 1, wherein the doped sacrificial material is one of p type doped poly-silicon and n type doped poly-silicon.

18. An avalanche trench optical detector device comprising:

a substrate;

a first set of trenches in the substrate having a doped material of a first conductivity;

a second set of trenches in the substrate having a doped material of a second conductivity, wherein trenches of the first set are alternately disposed with respect to trenches of the second set;

a multiplication region in the substrate surrounding a lower portion of the first set and the second set of trenches, wherein the multiplication region comprises about 10 percent of a photoactive area; and a first connection and a second connection coupled to the first set of trenches and the second set of trenches respectively.

* * * * *